United States Patent
Jeong et al.

(10) Patent No.: US 7,714,662 B2
(45) Date of Patent: May 11, 2010

(54) MULTIBAND OUTPUT IMPEDANCE MATCHING CIRCUIT HAVING PASSIVE DEVICES, AMPLIFIER INCLUDING MULTIBAND INPUT IMPEDANCE MATCHING CIRCUIT HAVING PASSIVE DEVICES, AND AMPLIFIER INCLUDING MULTIBAND INPUT/OUTPUT IMPEDANCE MATCHING CIRCUIT HAVING PASSIVE DEVICES

(75) Inventors: Moon Suk Jeong, Gyunggi-Do (KR); Nam Heung Kim, Gyunggi-Do (KR); Kwang Du Lee, Jeollanam-Do (KR); Jeong Hoon Kim, Gyunggi-Do (KR)

(73) Assignees: Samsung Electro-Mechanics Co., Ltd., Suwon, Gyunggi-Do (KR); ICU Research and Industrial Cooperation Group, Daejeon (KR)

( * ) Notice: Subject to any disclaimer, the term of this patent is extended or adjusted under 35 U.S.C. 154(b) by 42 days.

(21) Appl. No.: 12/233,352

(22) Filed: Sep. 18, 2008

(65) Prior Publication Data

US 2009/0085670 A1 Apr. 2, 2009

(30) Foreign Application Priority Data

Sep. 28, 2007 (KR) ...................... 10-2007-0098280

(51) Int. Cl.
*H03F 3/191* (2006.01)
(52) U.S. Cl. .................. 330/302; 330/126; 330/311
(58) Field of Classification Search ................ 330/126, 330/277, 302, 311
See application file for complete search history.

(56) References Cited

U.S. PATENT DOCUMENTS

| | | | |
|---|---|---|---|
| 6,121,840 A * | 9/2000 | Sakusabe | 330/277 |
| 6,278,329 B1 * | 8/2001 | Palmisano et al. | 330/302 |
| 7,023,272 B2 | 4/2006 | Hung et al. | |
| 7,167,044 B2 | 1/2007 | Li et al. | |
| 2006/0132242 A1 * | 6/2006 | Han et al. | 330/311 |
| 2008/0169877 A1 * | 7/2008 | Banba | 330/311 |

\* cited by examiner

*Primary Examiner*—Khanh V Nguyen
(74) *Attorney, Agent, or Firm*—Lowe Hauptman Ham & Berner (57) ABSTRACT

Disclosed are a multiband output impedance matching circuit having passive devices, an amplifier including a multiband input impedance matching circuit having passive devices, and an amplifier including a multiband input/output impedance matching circuit having passive devices, which can be miniaturized without a separate output terminal buffer and reduce current consumption by using the passive devices.

19 Claims, 7 Drawing Sheets

MULTIBAND OUTPUT IMPEDANCE MATCHING CIRCUIT HAVING PASSIVE DEVICES, AMPLIFIER INCLUDING MULTIBAND INPUT IMPEDANCE MATCHING CIRCUIT HAVING PASSIVE DEVICES, AND AMPLIFIER INCLUDING MULTIBAND INPUT/OUTPUT IMPEDANCE MATCHING CIRCUIT HAVING PASSIVE DEVICES

CROSS-REFERENCE TO RELATED APPLICATIONS

This application claims the priority of Korean Patent Application No. 2007-98280 filed on Sep. 28, 2007, in the Korean Intellectual Property Office, the disclosure of which is incorporated herein by reference.

BACKGROUND OF THE INVENTION

1. Field of the Invention

The present invention relates to an output impedance matching circuit, and an amplifier having an input impedance matching circuit or an input/output impedance matching circuit, and more particularly, to a multiband output impedance matching circuit having passive devices, an amplifier including a multiband input impedance matching circuit having passive devices, and an amplifier including a multiband input/output impedance matching circuit having passive devices, which can be miniaturized without using a separate output terminal buffer, and reducing current consumption by using passive devices.

2. Description of the Related Art

The recent development of wireless communication technologies is introducing various wireless communication devices in everyday life.

More frequency bands are being used because of the introduction of the various wireless communication devices. Also, as a plurality of wireless communication devices are being applied to real life, a need for convergence of wireless communication devices using different frequency bands has arisen.

The wireless communication device includes a first-stage low-noise amplifier, and a driving amplifier. The first-stage low-noise amplifier receives a wireless communication signal and matches impedance of the received wireless communication signal. The driving amplifier matches impedance of a wireless communication signal, and amplifies and then outputs the wireless communication signal.

The amplifier includes an input/output impedance matching circuit to transmit/receive a wireless communication signal.

However, in order to transmit and receive multiband wireless communication signals, such a related art amplifier includes an input/output impedance matching circuit that uses an active device for choosing multiple frequency bands or a separate circuit for the choosing is additionally adapted, thereby causing the amplifier to increase in size and power consumption.

SUMMARY OF THE INVENTION

An aspect of the present invention provides a multiband output impedance matching circuit having passive devices, an amplifier including a multiband input impedance matching circuit having passive devices, and an amplifier including a multiband input/output impedance matching circuit having passive devices, which can be miniaturized without a separate output terminal buffer and reduce current consumption by using the passive devices.

According to an aspect of the present invention, there is provided a multiband output impedance matching circuit having passive devices, the multiband output impedance matching circuit including: first and second inductors connected in series to each other between a radio frequency (RF) signal input terminal and a driving power terminal supplying preset driving power; and a first capacitor connected in series between an RF signal output terminal and a node between the first and second inductors. The multiband output impedance matching circuit matches impedance with the RF signal output terminal. A first output frequency band is set according to resonance of inductance of the first inductor and capacitance of the first capacitor. A second output frequency band which is higher than the first output frequency band is set according to resonance of combined inductance of the first and second inductors and capacitance of the first capacitor.

According to another aspect of the present invention, there is provided an amplifier including a multiband input impedance matching circuit having passive devices, the amplifier including: a cascode amplification unit amplifying an impedance-matched radio frequency (RF) input signal; and an input impedance matching circuit connected in series between an RF signal input terminal and the cascode amplification unit and matching impedance with the RF signal input terminal. The cascode amplification unit includes a first transistor connected to an output terminal of the input impedance matching circuit, and a second transistor cascode-connected to the first transistor, the cascode amplification unit amplifying an RF signal from the input impedance matching circuit. The input impedance matching circuit includes a first capacitor connected in series to the RF signal input terminal, a first inductor connected in parallel to an output terminal of the first capacitor, a second capacitor connected in parallel to the output terminal of the first capacitor, and a second inductor connected in series between a ground terminal and a node between a source terminal of the first transistor and the second capacitor. A first input frequency band is set according to resonance of capacitance of the first capacitor and inductance of the first inductor, and a second input frequency band which is higher than the first input frequency band is set according to resonance of inductance of the second inductor and a parallel combination of capacitance of the second capacitor and parasitic capacitance of the first transistor.

The first inductor of the input impedance matching circuit may have one end connected to the output terminal of the first capacitor, and the other end receiving a preset first bias voltage and transmitting the voltage to a gate of the first transistor.

The second capacitor may be connected between a gate terminal and a source terminal of the first transistor.

The second transistor may receive a preset second bias voltage through a gate.

According to another aspect of the present invention, there is provided an amplifier including a multiband input impedance matching circuit having passive devices, the amplifier including: a cascode amplification unit amplifying an impedance-matched radio frequency (RF) input signal; and an input impedance matching circuit connected in series between a RF signal input terminal and the cascode amplification unit and matching impedance with the RF signal input terminal. The cascode amplification unit includes a first transistor connected to an output terminal of the input impedance matching circuit, and a second transistor cascode-connected to the first transistor, the cascode amplification unit amplifying an RF signal from the input impedance matching circuit. The input impedance matching circuit includes first and second capacitors connected in series to the RF signal input terminal, a first inductor connected in series between a ground terminal and a node between the first and second capacitors, a second inductor connected in series between an output terminal of the second capacitor and a gate terminal of the first transistor, a third capacitor connected between the gate terminal and a source terminal of the first transistor, and a third inductor connected in series between the source terminal of the first transistor and a ground terminal. A first input frequency band is set according to resonance of capacitance of the first and second capacitors and inductance of the first inductor. A second input frequency band which is higher than the first input frequency band is set according to resonance of inductance of the second and third inductors and a parallel combination of capacitance of the third capacitor and parasitic capacitance of the first transistor.

A gate of the first transistor may receive a preset first bias voltage.

A gate of the second transistor may receive a preset second bias voltage.

According to another aspect of the present invention, there is provided an amplifier including a multiband input/output impedance matching circuit having passive devices, the amplifier including: a cascode amplification unit amplifying an impedance-matched radio frequency (RF) input signal; an input impedance matching circuit connected in series between an RF signal input terminal and the cascode amplification unit and matching impedance with the RF signal input terminal; and an output impedance matching circuit connected in series between an RF signal output terminal and the cascode amplification unit and matching impedance with the RF signal output terminal. The cascode amplification unit includes a first transistor connected to an output terminal of the input impedance matching circuit, and a second transistor cascode-connected to the first transistor, the cascode amplification unit amplifying an RF signal from the input impedance matching circuit. The input impedance matching circuit includes a first capacitor connected in series to the RF signal input terminal, a first inductor connected in parallel to an output terminal of the first capacitor, a second capacitor connected in parallel to the output terminal of the first capacitor, and a second inductor connected in series between a source terminal of the first transistor and a ground terminal. A first input frequency band is set according to resonance of capacitance of the first capacitor and inductance of the first inductor. A second input frequency band which is higher than the first input frequency band is set according to resonance of inductance of the second inductor and a parallel combination of capacitance of the second capacitor and parasitic capacitance of the first transistor. The output impedance matching circuit includes third and fourth inductors connected in series to each other between an amplification signal output terminal of the cascode amplification unit and a driving power terminal supplying preset driving power, and a third capacitor connected in series between the RF signal output terminal and a node between the third and fourth inductors. A first output frequency band is set according to resonance of inductance of the third inductor and capacitance of the third capacitor. A second output frequency band which is higher than the first output frequency band is set according to resonance of combined inductance of the third and fourth inductors and capacitance of the third capacitor.

The first inductor of the input impedance matching circuit may have one end connected to an output terminal of the first capacitor, and the other end receiving a preset first bias voltage and transmitting the voltage to a gate of the first transistor.

The second capacitor may be connected between a gate terminal and a source terminal of the first transistor.

The second transistor may receive a preset second bias voltage through a gate.

The output impedance matching circuit may further include a first resistor connected in parallel to the third inductor and stabilizing an amplification operation of the cascode amplification unit.

A resonant frequency of the first input frequency band may be the same as a resonant frequency of the first output frequency band. A resonant frequency of the second input frequency band may be the same as a resonant frequency of the second output frequency band.

According to another aspect of the present invention, there is provided an amplifier including a multiband input/output impedance matching circuit having passive devices, the amplifier including: a cascode amplification unit amplifying an impedance-matched radio frequency (RF) input signal; an input impedance matching circuit connected in series between a radio frequency (RF) signal input terminal and the cascode amplification unit and matching impedance with the RF signal input terminal; and an output impedance matching circuit connected in series between an RF signal output terminal and the cascode amplification unit and matching impedance with the RF signal output terminal. The cascode amplification unit includes a first transistor connected to an output terminal of the input impedance matching circuit, and a second transistor cascode-connected to the first transistor, the cascode amplification unit amplifying an RF signal from the input impedance matching circuit. The input impedance matching circuit includes first and second capacitors connected in series to the RF signal input terminal, a first inductor connected in series between a ground terminal and a node between the first and second capacitors, a second inductor connected in series between an output terminal of the second capacitor and a gate terminal of the first transistor, a third capacitor connected between a gate terminal and a source terminal of the first transistor, and a third inductor connected in series between the source terminal of the first transistor and a ground terminal. A first input frequency band is set according to resonance of capacitance of the first and second capacitors and inductance of the first inductor. A second input frequency band which is higher than the first input frequency band is set according to resonance of inductance of the second and third inductors and a parallel combination of capacitance of the third capacitor and parasitic capacitance of the first transistor. The output impedance matching circuit includes fourth and fifth inductors connected in series between an amplification signal output terminal of the cascode amplification unit and a driving power terminal supplying preset driving power, and a fourth capacitor connected in series between the RF signal output terminal and a node between the fourth and fifth inductors. A first output frequency band is set according to resonance of inductance of the fourth inductor and capacitance of the fourth capacitor. A second output frequency band which is higher than the first output frequency band is set according to combined inductance of the fourth and fifth inductors and capacitance of the fourth capacitor.

A gate of the first transistor may receive a preset first bias voltage.

A gate of the second transistor may receive a preset second bias voltage.

The output impedance matching circuit may further include a first resistor connected in parallel to the fourth inductor and stabilizing an amplification operation of the cascode amplification unit.

A resonant frequency of the first input frequency band may be the same as a resonant frequency of the first output frequency band. A resonant frequency of the second input frequency band may be the same as a resonant frequency of the second output frequency band.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
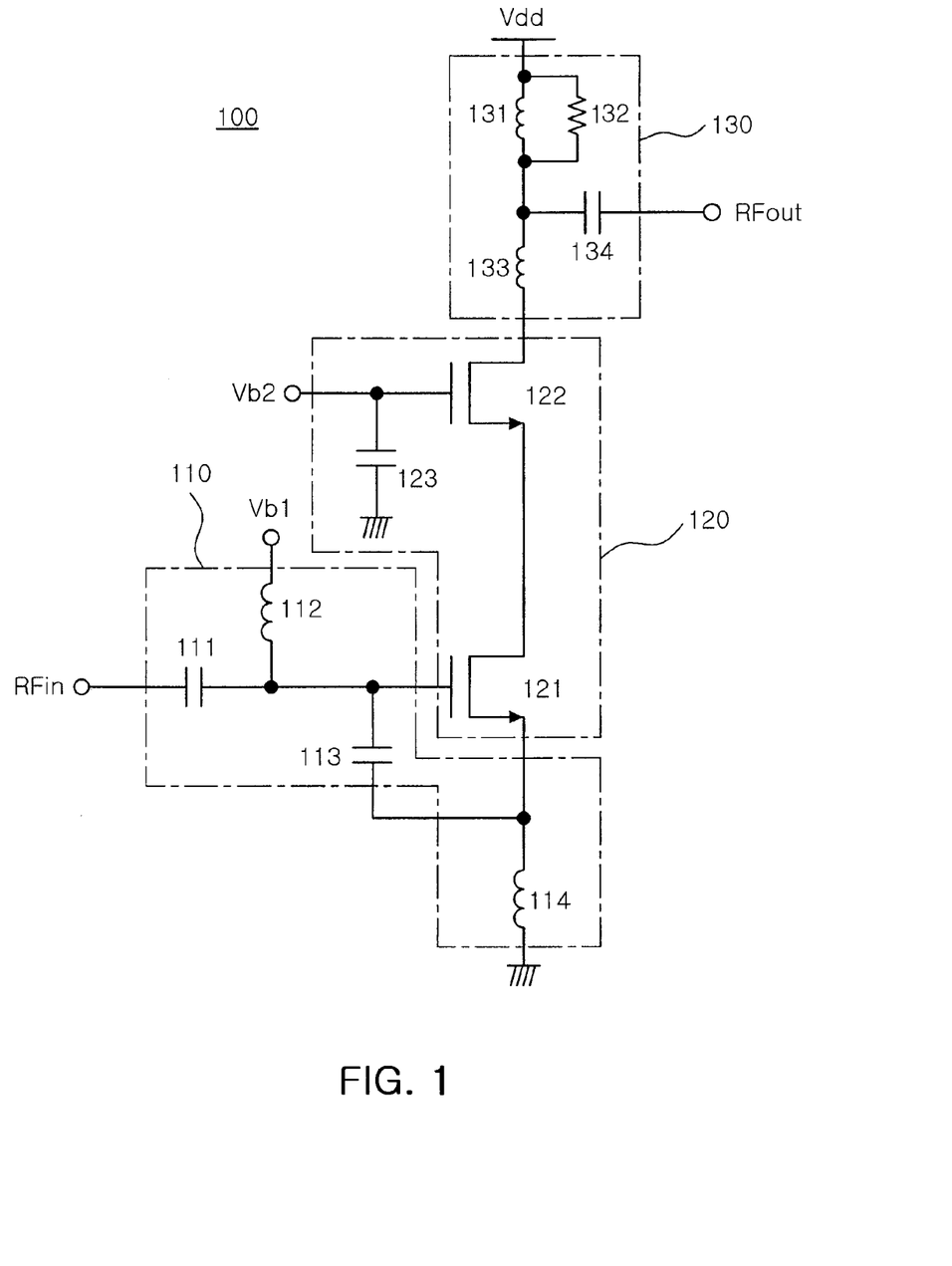
FIG. 1 is a circuit diagram of an amplifier according to an exemplary embodiment of the present invention.

FIG. 1 is a circuit diagram of an amplifier according to an exemplary embodiment of the present invention.

Referring to FIG. 1, an amplifier 100 according to the current embodiment includes an input impedance matching circuit 110, a cascode amplification unit 120, and an output impedance matching circuit 130.

The input impedance matching circuit 110 may include first and second capacitors 111 and 113, a first inductor 112, and a second inductor 114.

The first capacitor 111 has one end connected to an input terminal RFin of a radio frequency (RF) signal and the other end connected to one end of the first inductor 112. The other end of the first inductor 112 receives a preset first bias voltage Vb1 and transmits it to the cascode amplification unit 120. The second capacitor 113 has one end connected to the one end of the first inductor 112 and the other end connected to the cascode amplification unit 120. The second inductor 114 is connected in series between ground and the cascode amplification unit 120.

The cascode amplification unit 120 may include first and second transistors 121 and 122, and a third capacitor 123.

The first and second transistors 121 and 122 are cascode-connected, and the second inductor 114 is connected in series between a source terminal of the first transistor 121 and the ground. The third capacitor 123 is connected in parallel between the ground and a second bias voltage terminal Vb2 applying a preset bias voltage to a gate terminal of the second transistor 122. The second capacitor 113 of the input impedance matching circuit 110 is connected between the source terminal and a gate terminal of the first transistor 121.

Each of the first and second transistors 121 and 122 may be configured as an N-type transistor, more preferably as a metal-oxide-semiconductor field-effect-transistor (an N-MOS FET).

The third capacitor 123 performs an input/output isolation function of the first transistor 121 and the second transistor 122.

The output impedance matching circuit 130 may include third and fourth inductors 131 and 133, a first resistor 132, and a fourth capacitor 134.

The fourth capacitor 134 is connected in series to an output terminal RFout of an RF signal. The third inductor 131 is connected between a driving power terminal Vdd supplying preset driving power and the fourth capacitor 134. The first resistor 132 is connected in parallel to the third inductor 131. The fourth inductor 133 is connected between the fourth capacitor 134 and a drain terminal of the second transistor 122, and thus connected in parallel to the third inductor 131.

Figure 2:
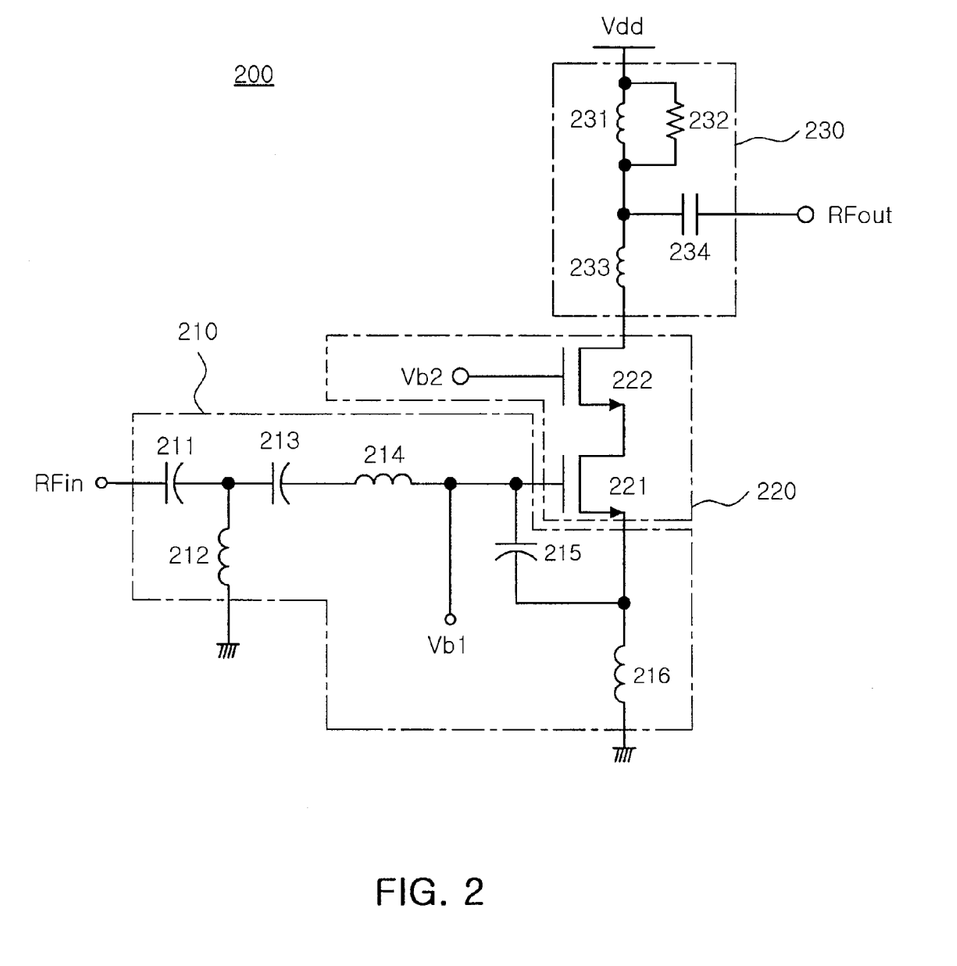
FIG. 2 is a circuit diagram of an amplifier according to another exemplary embodiment of the present invention.

FIG. 2 is a circuit diagram of an amplifier according to another exemplary embodiment of the present invention.

Referring to FIG. 2, an amplifier 200 according to the current embodiment may include an input impedance matching circuit 210, a cascode amplification unit 220, and an output impedance matching circuit 230.

The input impedance matching circuit 210 may include first to third capacitors 211, 213 and 215, and first to third inductors 212, 214 and 216.

The first and second capacitors 211 and 213 are connected in series between an input terminal RFin of an RF signal and a cascode amplification unit 220. The first inductor 212 is connected in series between ground and a node between the first capacitor 211 and the second capacitor 213.

The cascode amplification unit 220 may include first and second transistors 221 and 222.

The first transistor 221 and the second transistor 222 are cascode-connected. The second inductor 214 is connected in series between the second capacitor 213 and a gate terminal of the first transistor 221. The third inductor 216 is connected in series between a source terminal of the first transistor 221 and the ground. The third capacitor 215 is connected between the gate terminal and a source terminal of the first transistor 221.

Preset first and second bias voltages Vb1 and Vb2 are respectively applied to the gate terminal of the first transistor 221 and a gate terminal of the second transistor 222.

As in the output impedance matching circuit 130 of the embodiment of FIG. 1, the output impedance matching circuit 230 of the current embodiment may include third and fourth inductors 231 and 233, a first resistor 232 and a fourth capacitor 234.

Figure 3:
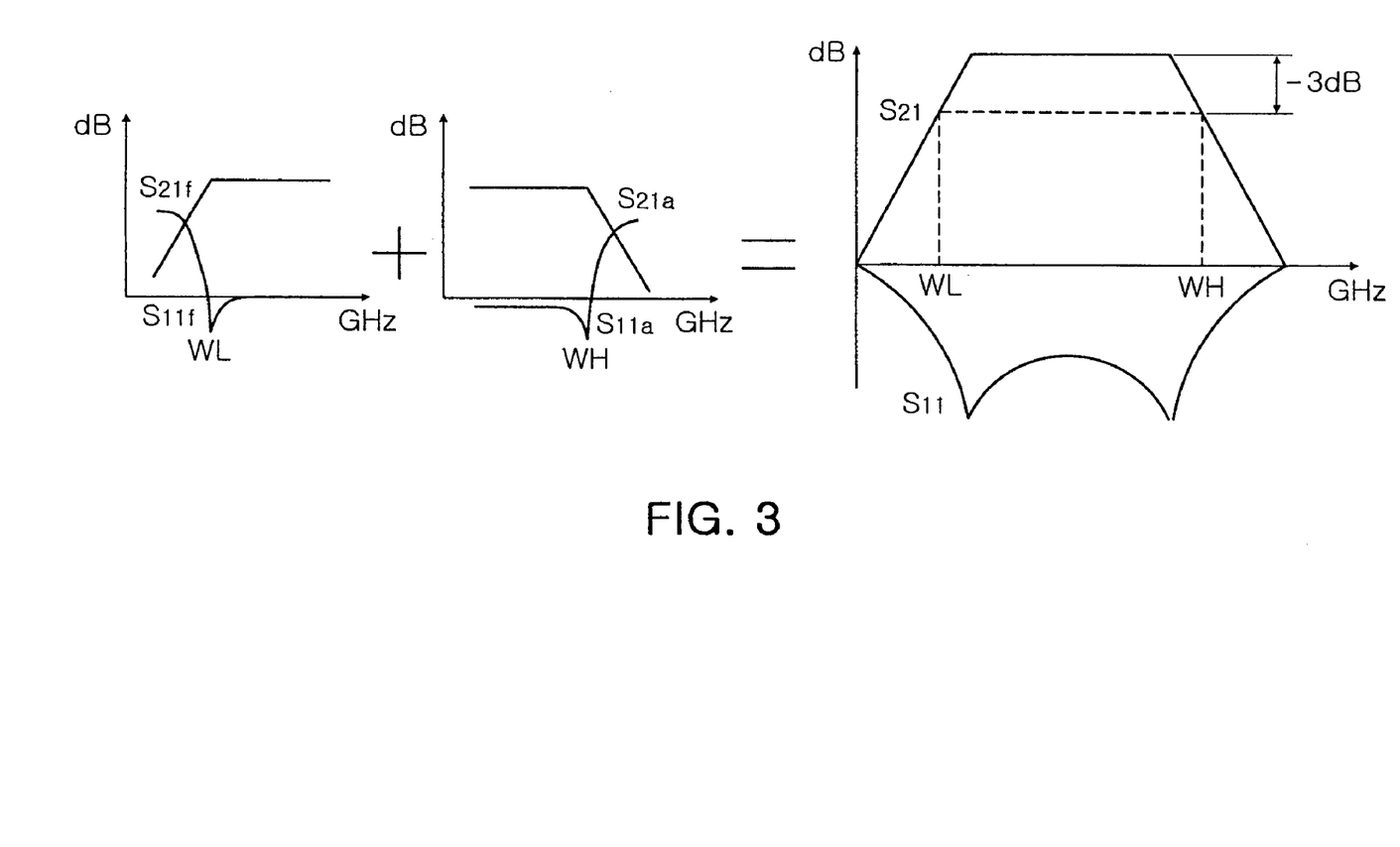
FIG. 3 is a graph for explaining a principle of multiband input impedance matching in an amplifier according to the present invention.

FIG. 3 is a graph for explaining a principle of achieving multiband impedance matching in an amplifier according to the present invention.

Referring to FIGS. 1 through 3, the input impedance matching circuits 110 and 210 and the cascode amplification units 120 and 220 of the amplifiers 100 and 200 have input impedance matching and band-reject characteristics based on the two-port circuit network theory.

That is, the input impedance matching circuits 110 and 210 have a high pass characteristic, and the cascode amplification units 120 and 220 have a low pass characteristic together with a part of circuit elements of the input impedance matching circuits 110 and 210. If the impedance matching is made correctly, the input impedance matching circuits 110 and 210 and the cascode amplification units 120 and 220 have a band pass characteristic.

In FIG. 3, S21$f$ represents a gain of the input impedance matching circuits 110 and 210, and S11$f$ represents a reflection coefficient of the input impedance matching circuits 110 and 210. Also, S21$a$ represents a gain obtained by a part of circuit elements of the input impedance matching circuits 110 and 210. S11$a$ represents a reflection coefficient by a part of circuit elements of the input impedance matching circuits 110 and 210.

In FIG. 3, S21=K(S21$f$)*(S21$a$), and S11=S11$f$+K(S11$f$)*S21$a$*S11$a$. Because K=1/(1−S21$f$*S11$a$), if a signal from the input impedance matching circuits 110 and 210 is sent to the cascode amplification units 120 and 220 without being reflected, the amplifiers 100 and 200 according to the embodiments of the present invention have a band pass characteristic which is a combination of the high pass characteristic of the input impedance matching circuits 110 and 210 and the low pass characteristic of the cascode amplification units 120 and 220.

Multiple resonant frequencies WL and WH may be set at a −3 dB cutoff point indicated in FIG. 3.

The setting of the multiple resonant frequencies WL and W maybe varied according to an embodiment of an amplifier having an input impedance matching circuit. This will be now described with reference to accompanying drawings.

Figure 4A:
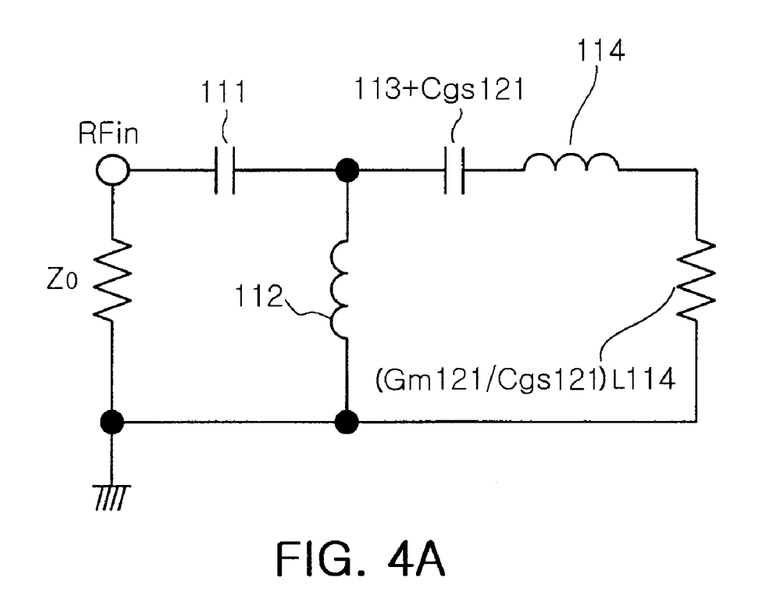
FIG. 4A is an equivalent circuit diagram of a radio-frequency (RF) signal input side of the amplifier according to the embodiment of FIG. 1.
Figure 4B:
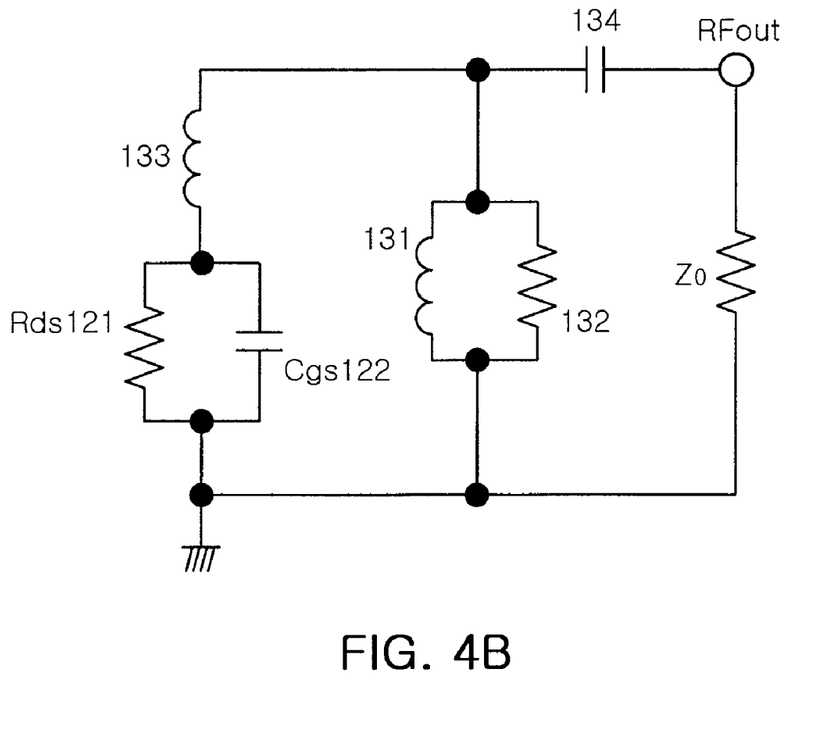
FIG. 4B is an equivalent circuit diagram of an RF signal output side of the amplifier according to the embodiment of FIG. 1.

FIG. 4A is an equivalent circuit diagram of an RF signal input side of the amplifier of FIG. 1, and FIG. 4B is an equivalent circuit diagram of an RF signal output side of the amplifier of FIG. 1.

Referring to FIG. 4A as well as FIGS. 1 and 3, FIG. 4A is an equivalent circuit diagram of the amplifier 100 of FIG. 1, viewed from an input terminal RFin of an RF signal. In FIG. 4A, a reference character Z represents preset impedance of the input terminal RFin of an RF signal.

The amplifier 100 of FIG. 1 viewed from the input terminal RFin of an RF signal includes a plurality of capacitors 111 and 113+Cgs121 and an inductor 114 connected in series to one end of the input terminal RFin, an inductor 112 connected between ground and a node between the capacitors 111 and 113+Cgs121, and a resistor (Gm121/Cgs121)L114 connected between the inductor 114 and the ground. A reference character of each element in FIG. 4A is identical to that of FIG. 1, and a reference character 113+Cgs121 represents parallel combination capacitance of capacitance of the second capacitor 113 and parasitic capacitance between a source terminal and a gate terminal of the first transistor 121 of FIG. 1. A reference character (Gm121/Cgs121)L114 means a multiplication of inductance of the second inductor 114 and a ratio of transconductance to parasitic capacitance of the first transistor 121 of FIG. 1.

The plurality of capacitors 111 and 113+Cgs121 and the inductor 112 constitute a T-shaped tertiary high-pass filter. The capacitor 111 is used to block a high-pass filter primary component and a DC component of an RF signal. The inductor 112 is used to block a high-pass filter secondary component and send a first bias voltage Vb1 to the first amplifier 121. The capacitor 113+Cgs121 is used to block a high-pass filter tertiary component.

Accordingly, a first input frequency band WL is set according to resonance of the inductance of the first inductor 112 and the capacitance of the first capacitor 111 of the input impedance matching circuit 110. A second input frequency band WH is set according to resonance of the inductance of the second inductor 114, the parallel combination capacitance 113+Cgs121 of the parasitic capacitance Cgs121 of the first transistor 121 and the capacitance of the second capacitor 113, and the transconductance of the first transistor 121. Here, imaginary number components on the Smith chart are canceled because the parasitic capacitance Cgs121 of the first transistor 121 is electrically opposite to the inductance of the second inductor 114. Thus, only the transconductance which is a real number component remains.

In addition, the second inductor 114 may prevent oscillation of the first transistor 121 by passing the DC component of an RF signal to the ground.

Referring to FIG. 4B as well as FIG. 1, FIG. 4B is an equivalent circuit diagram of the amplifier 100 of FIG. 1, viewed from an output terminal RFout of an RF signal. In FIG. 4B, a reference character $Z_0$ represents preset impedance of the output terminal RFout of an RF signal.

The amplifier 100 of FIG. 1 viewed from the output terminal RFout of an RF signal includes a capacitor 134 having one end connected in series to the output terminal RFout, a plurality of inductors 131 and 133 and a resistor 132 connected in parallel to the other end of the capacitor 134, and a resistor Rds122 and a capacitor Cgs122 connected in parallel to the inductor 133 and ground. Here, a reference character of each element is identical to that of FIG. 1, and a reference character Rds122 represents a turn-on resistance of the second transistor 122 of FIG. 1, and a reference character Cgs122 represents parasitic capacitance of the second transistor 122 of FIG. 1.

Because the inductor 133 has high impedance when an RF signal is in a low frequency band, a first output frequency band is determined by the inductance of the inductor 131 and the capacitance of the capacitor 134. When the RF signal is in a high frequency band, a second output frequency band is determined by the parallel combined inductance of the plurality of inductors 131 and 133 and the capacitance of the capacitor 134. The capacitor 134 is used to block a DC component of an RF signal, and the resistor 132 is used to stabilize an amplification operation of the cascode amplifier 120.

Figure 5:
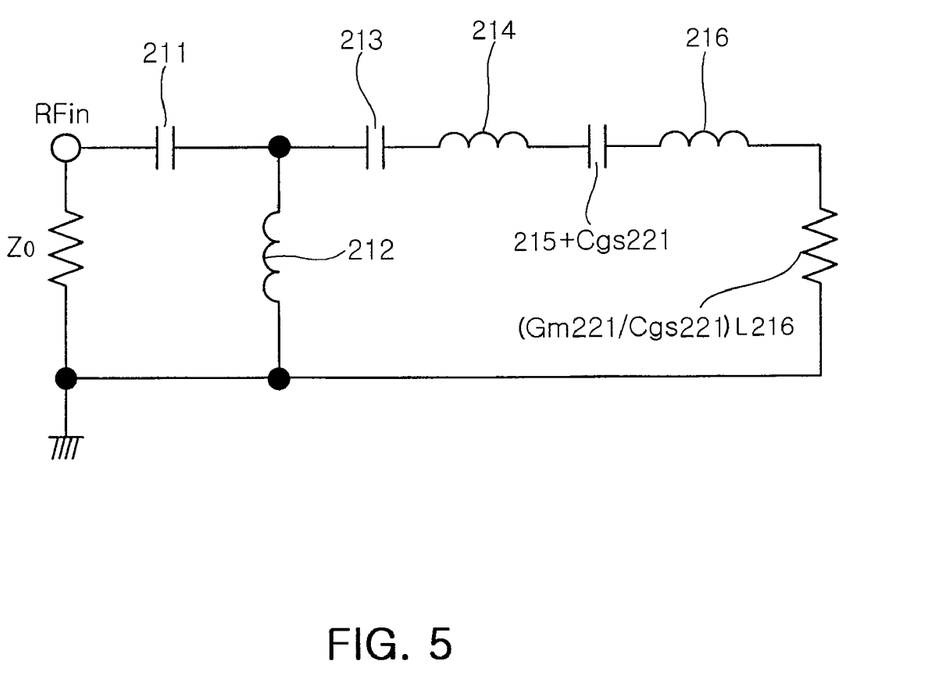
FIG. 5 is an equivalent circuit diagram of an RF signal input side of the amplifier according to the embodiment of FIG. 2.

FIG. 5 is an equivalent circuit diagram of an RF signal input side of the amplifier of FIG. 2.

Referring to FIG. 5 as well as FIG. 2, FIG. 5 is an equivalent circuit diagram of the amplifier 200, viewed from an input terminal RFin of an RF signal. Here, a reference character Z represents preset impedance of the input terminal RFin of an RF signal.

The amplifier 200 of FIG. 2 viewed from the input terminal RFin of an RF signal includes a plurality of capacitors 211, 213 and 215+Cgs221 and a plurality of inductors 214 and 216 connected in series to the input terminal RFin, an inductor 212 connected between ground and a node between the capacitors 211 and 213, and a resistor (Gm221/Cgs221)L216 connected between the inductor 216 and the ground. A reference character of each element is identical to that of FIG. 2, and a reference character 215+Cgs221 represents parallel combination capacitance of capacitance of the third capacitor 215 and parasitic capacitance between a source terminal and a gate terminal of the first transistor 221 of FIG. 2. A reference character (Gm221/Cgs221)L216 means a multiplication of inductance of the third inductor 214 and a ratio of transconductance of the first transistor 221 to parasitic capacitance of the first transistor 221 of FIG. 2.

The plurality of capacitors 211 and 213 and the inductor 212 constitute a T-shaped tertiary high-pass filter. The first capacitor 211 is used to block a high-pass filter primary component and a DC component of an RF signal. The first inductor 212 is used to block a high pass filter secondary component, and the second capacitor 213 is used to block a high pass filter tertiary component.

Accordingly, the first input frequency band WL is set according to resonance of the capacitance of the first capacitor 211, the inductance of the first inductor 212 and the capacitance of the second capacitor 213 of the input impedance matching circuit 210. The second input frequency band WH is set according to the resonance of the inductance of the second and third inductors 214 and 216, the transconductance of the first transistor 221, and the parallel combination capacitance 215+Cgs221 of the parasitic capacitance Cgs211 of the first transistor 221 and the capacitance of the third capacitor 215.

Figure 6A:
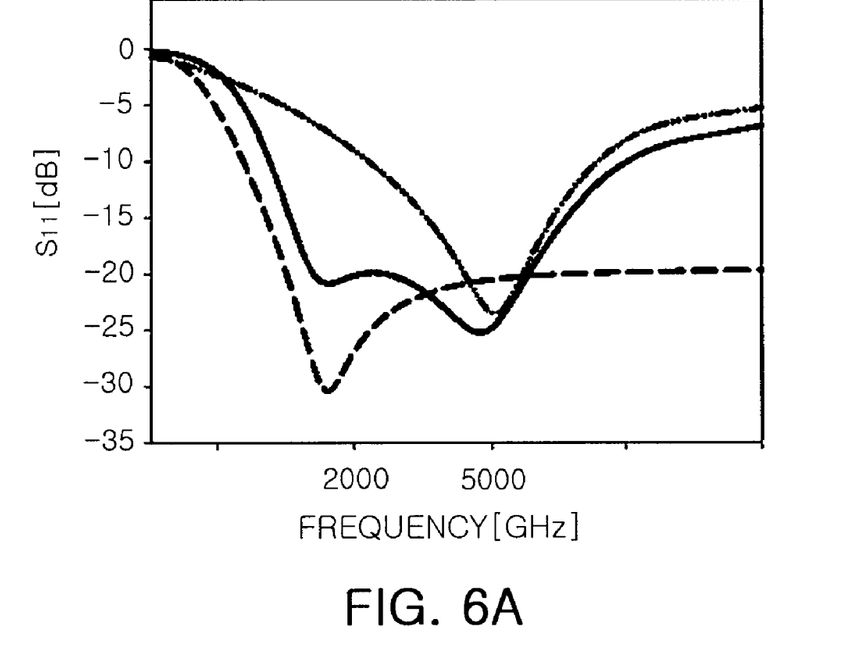
FIGS. 6A and 6B are graphs showing multiband input impedance matching of an amplifier according to the present invention.
Figure 6B:
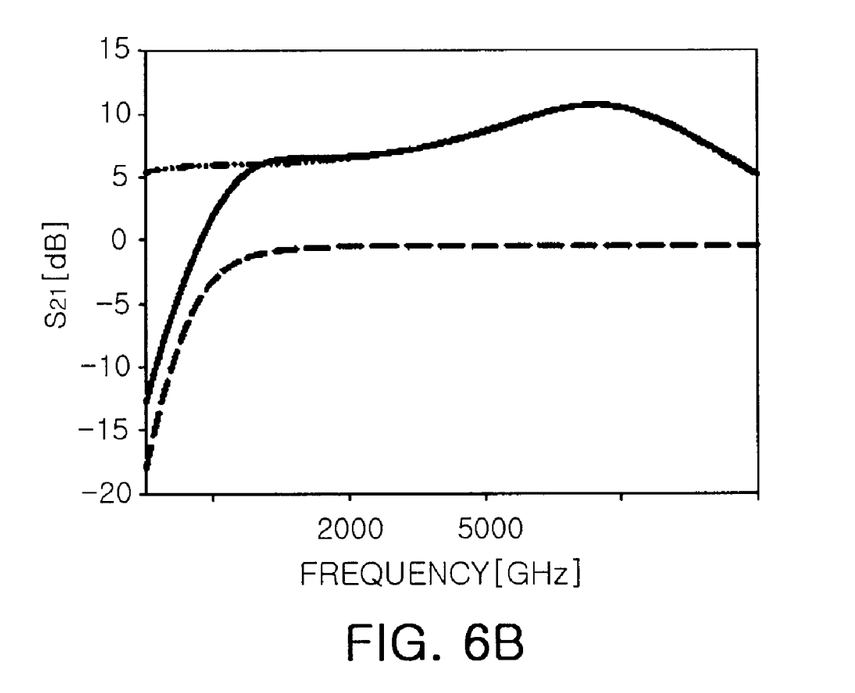

FIGS. 6A and 6B are graphs showing multiband input impedance matching of an amplifier according to the present invention.

Referring to FIGS. 6A and 6B together with FIG. 3, FIGS. 6A and 6B show a simulation result of multiband input impedance matching based on the input impedance matching principle of FIG. 3. In FIG. 6A, a solid line represents the reference character S11 of FIG. 3, a dotted line represents the reference character S11$a$ of FIG. 3, and a dashed double-dotted line represents the reference character S11$f$ of FIG. 3. Likewise, in FIG. 6B, a solid line represents the reference character S21 of FIG. 3, a dotted line represents the reference character S21$a$ of FIG. 3, and a dashed double-dotted line represents the reference character S21$f$ of FIG. 3.

Figure 7A:
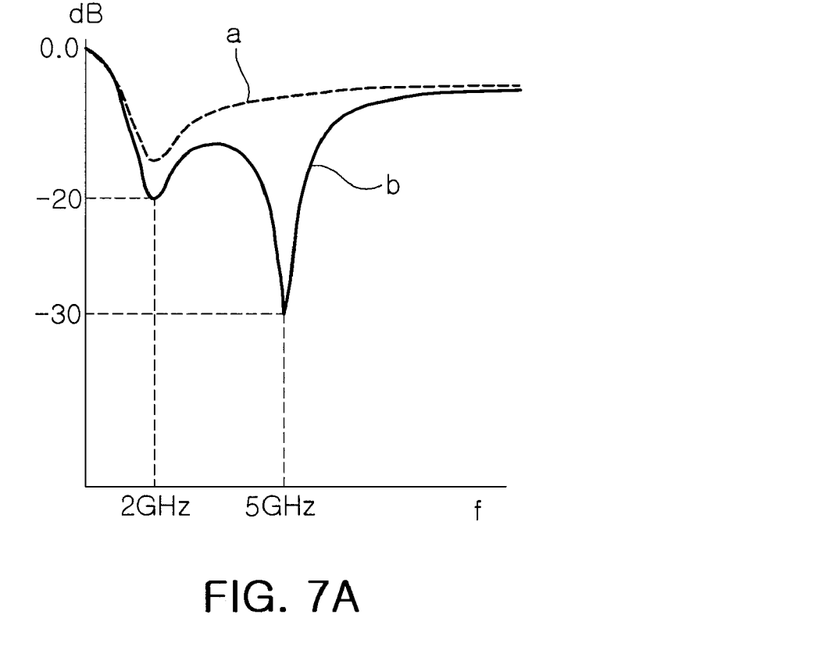
FIGS. 7A and 7B are graphs showing multiband output impedance matching of an amplifier according to the present invention.
Figure 7B:
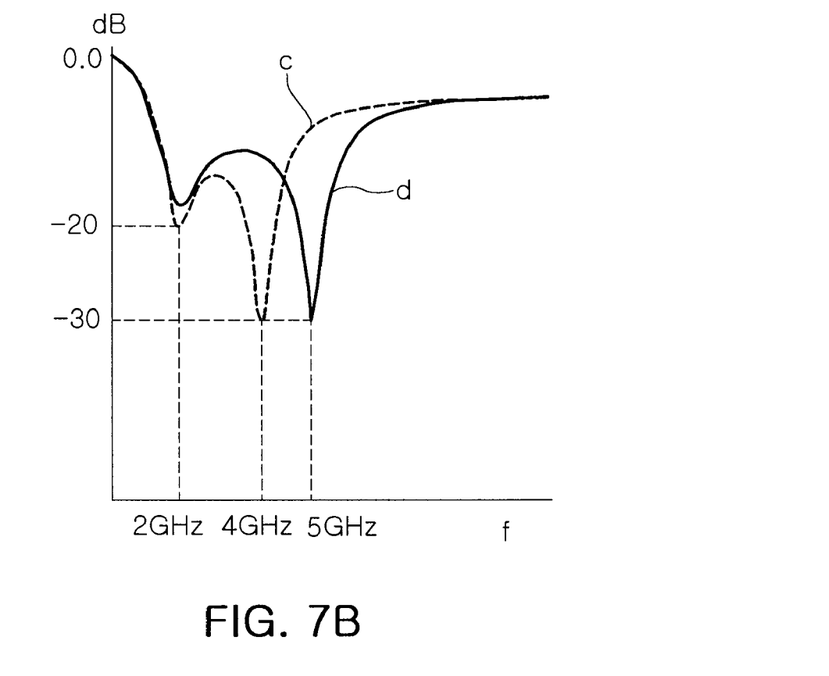

FIGS. 7A and 7B are graphs showing multiband output impedance matching of an amplifier according to the present invention.

Referring to FIG. 7A together with FIGS. 1 and 4B, a reference character 'a' indicates a result of an output impedance simulation when the fourth inductor 133 is not used in the output impedance matching circuit 130. Also, a reference character 'b' indicates a result of an output impedance simulation when the fourth inductor 133 is used in the output impedance matching circuit 130.

Referring to FIG. 7B together with FIGS. 1 and 4B, it can be seen that the result of the output impedance simulation reveals that when the inductance of the fourth inductor 133 is varied, the output impedance matching is changed in a high frequency band without being changed in a low frequency band.

As shown in FIGS. 7A and 7B, it can be seen that the multiband output impedance matching is achieved by using the fourth inductor 133 in the output impedance matching circuit 130.

According to the present invention, a multiband output impedance matching circuit having passive devices, an amplifier including a multiband input impedance matching circuit having passive devices, and an amplifier including a multiband input/output impedance matching circuit having passive devices can be miniaturized because no separate circuit for multiband selection is necessary. Also, current consumption can be reduced because of the use of the passive devices.

While the present invention has been shown and described in connection with the exemplary embodiments, it will be apparent to those skilled in the art that modifications and variations can be made without departing from the spirit and scope of the invention as defined by the appended claims.

What is claimed is:

1. A multiband output impedance matching circuit having passive devices, the multiband output impedance matching circuit comprising:

first and second inductors connected in series to each other between a radio frequency (RF) signal input terminal and a driving power terminal supplying preset driving power; and a first capacitor connected in series between an RF signal output terminal and a node between the first and second inductors, wherein the multiband output impedance matching circuit matches impedance with the RF signal output terminal, a first output frequency band is set according to resonance of inductance of the first inductor and capacitance of the first capacitor, and a second output frequency band which is higher than the first output frequency band is set according to resonance of combined inductance of the first and second inductors and capacitance of the first capacitor.

2. An amplifier including a multiband input impedance matching circuit having passive devices, the amplifier comprising:

a cascode amplification unit amplifying an impedance-matched radio frequency (RF) input signal; and an input impedance matching circuit connected in series between an RF signal input terminal and the cascode amplification unit and matching impedance with the RF signal input terminal, wherein the cascode amplification unit comprises a first transistor connected to an output terminal of the input impedance matching circuit, and a second transistor cascode-connected to the first transistor, the cascode amplification unit amplifying an RF signal from the input impedance matching circuit, the input impedance matching circuit comprises a first capacitor connected in series to the RF signal input terminal, a first inductor connected in parallel to an output terminal of the first capacitor, a second capacitor connected in parallel to the output terminal of the first capacitor, and a second inductor connected in series between a ground terminal and a node between a source terminal of the first transistor and the second capacitor, and a first input frequency band is set according to resonance of capacitance of the first capacitor and inductance of the first inductor, and a second input frequency band which is higher than the first input frequency band is set according to resonance of inductance of the second inductor and a parallel combination of capacitance of the second capacitor and parasitic capacitance of the first transistor.

3. The amplifier of claim 2, wherein the first inductor of the input impedance matching circuit has one end connected to the output terminal of the first capacitor, and the other end receiving a preset first bias voltage and transmitting the voltage to a gate of the first transistor.

4. The amplifier of claim 2, wherein the second capacitor is connected between a gate terminal and a source terminal of the first transistor.

5. The amplifier of claim 2, wherein the second transistor receives a preset second bias voltage through a gate.

6. An amplifier including a multiband input impedance matching circuit having passive devices, the amplifier comprising:

a cascode amplification unit amplifying an impedance-matched radio frequency (RF) input signal; and an input impedance matching circuit connected in series between a RF signal input terminal and the cascode amplification unit and matching impedance with the RF signal input terminal, wherein the cascode amplification unit comprises a first transistor connected to an output terminal of the input impedance matching circuit, and a second transistor cascode-connected to the first transistor, the cascode amplification unit amplifying an RF signal from the input impedance matching circuit, the input impedance matching circuit comprises first and second capacitors connected in series to the RF signal input terminal, a first inductor connected in series between a ground terminal and a node between the first and second capacitors, a second inductor connected in series between an output terminal of the second capacitor and a gate terminal of the first transistor, a third capacitor connected between the gate terminal and a source terminal of the first transistor, and a third inductor connected in series between the source terminal of the first transistor and a ground terminal, a first input frequency band is set according to resonance of capacitance of the first and second capacitors and inductance of the first inductor, and a second input frequency band which is higher than the first input frequency band is set according to resonance of inductance of the second and third inductors and a parallel combination of capacitance of the third capacitor and parasitic capacitance of the first transistor.

7. The amplifier of claim 6, wherein a gate of the first transistor receives a preset first bias voltage.

8. The amplifier of claim 6, wherein a gate of the second transistor receives a preset second bias voltage.

9. An amplifier including a multiband input/output impedance matching circuit having passive devices, the amplifier comprising:

a cascode amplification unit amplifying an impedance-matched radio frequency (RF) input signal;

an input impedance matching circuit connected in series between an RF signal input terminal and the cascode amplification unit and matching impedance with the RF signal input terminal; and an output impedance matching circuit connected in series between an RF signal output terminal and the cascode amplification unit and matching impedance with the RF signal output terminal, wherein the cascode amplification unit comprises a first transistor connected to an output terminal of the input impedance matching circuit, and a second transistor cascode-connected to the first transistor, the cascode amplification unit amplifying an RF signal from the input impedance matching circuit, the input impedance matching circuit comprises a first capacitor connected in series to the RF signal input terminal, a first inductor connected in parallel to an output terminal of the first capacitor, a second capacitor connected in parallel to the output terminal of the first capacitor, and a second inductor connected in series between a source terminal of the first transistor and a ground terminal, wherein a first input frequency band is set according to resonance of capacitance of the first capacitor and inductance of the first inductor, and a second input frequency band which is higher than the first input frequency band is set according to resonance of inductance of the second inductor and a parallel combination of capacitance of the second capacitor and parasitic capacitance of the first transistor, and the output impedance matching circuit comprises third and fourth inductors connected in series to each other between an amplification signal output terminal of the cascode amplification unit and a driving power terminal supplying preset driving power, and a third capacitor connected in series between the RF signal output terminal and a node between the third and fourth inductors, wherein a first output frequency band is set according to resonance of inductance of the third inductor and capacitance of the third capacitor, and a second output frequency band which is higher than the first output frequency band is set according to resonance of combined inductance of the third and fourth inductors and capacitance of the third capacitor.

10. The amplifier of claim 9, wherein the first inductor of the input impedance matching circuit has one end connected to an output terminal of the first capacitor, and the other end receiving a preset first bias voltage and transmitting the voltage to a gate of the first transistor.

11. The amplifier of claim 9, wherein the second capacitor is connected between a gate terminal and a source terminal of the first transistor.

12. The amplifier of claim 9, wherein the second transistor receives a preset second bias voltage through a gate.

13. The amplifier of claim 9, wherein the output impedance matching circuit further comprises a first resistor connected in parallel to the third inductor and stabilizing an amplification operation of the cascode amplification unit.

14. The amplifier of claim 9, wherein a resonant frequency of the first input frequency band is the same as a resonant frequency of the first output frequency band, and a resonant frequency of the second input frequency band is the same as a resonant frequency of the second output frequency band.

15. An amplifier including a multiband input/output impedance matching circuit having passive devices, the amplifier comprising:

a cascode amplification unit amplifying an impedance-matched radio frequency (RF) input signal;

an input impedance matching circuit connected in series between a radio frequency (RF) signal input terminal and the cascode amplification unit and matching impedance with the RF signal input terminal; and an output impedance matching circuit connected in series between an RF signal output terminal and the cascode amplification unit and matching impedance with the RF signal output terminal, wherein the cascode amplification unit comprises a first transistor connected to an output terminal of the input impedance matching circuit, and a second transistor cascode-connected to the first transistor, the cascode amplification unit amplifying an RF signal from the input impedance matching circuit, the input impedance matching circuit comprises first and second capacitors connected in series to the RF signal input terminal, a first inductor connected in series between a ground terminal and a node between the first and second capacitors, a second inductor connected in series between an output terminal of the second capacitor and a gate terminal of the first transistor, a third capacitor connected between a gate terminal and a source terminal of the first transistor, and a third inductor connected in series between the source terminal of the first transistor and a ground terminal, wherein a first input frequency band is set according to resonance of capacitance of the first and second capacitors and inductance of the first inductor, and a second input frequency band which is higher than the first input frequency band is set according to resonance of inductance of the second and third inductors and a parallel combination of capacitance of the third capacitor and parasitic capacitance of the first transistor, and the output impedance matching circuit comprises fourth and fifth inductors connected in series between an amplification signal output terminal of the cascode amplification unit and a driving power terminal supplying preset driving power, and a fourth capacitor connected in series between the RF signal output terminal and a node between the fourth and fifth inductors, wherein a first output frequency band is set according to resonance of inductance of the fourth inductor and capacitance of the fourth capacitor, and a second output frequency band which is higher than the first output frequency band is set according to combined inductance of the fourth and fifth inductors and capacitance of the fourth capacitor.

16. The amplifier of claim 15, wherein a gate of the first transistor receives a preset first bias voltage.

17. The amplifier of claim 15, wherein a gate of the second transistor receives a preset second bias voltage.

18. The amplifier of claim 15, wherein the output impedance matching circuit further comprises a first resistor connected in parallel to the fourth inductor and stabilizing an amplification operation of the cascode amplification unit.

19. The amplifier of claim 15, wherein a resonant frequency of the first input frequency band is the same as a resonant frequency of the first output frequency band, and a resonant frequency of the second input frequency band is the same as a resonant frequency of the second output frequency band.

* * * * *

UNITED STATES PATENT AND TRADEMARK OFFICE
CERTIFICATE OF CORRECTION

| | |
|---|---|
| PATENT NO. | : 7,714,662 B2 |
| APPLICATION NO. | : 12/233352 |
| DATED | : May 11, 2010 |
| INVENTOR(S) | : Moon Suk Jeong et al. |

Page 1 of 1

It is certified that error appears in the above-identified patent and that said Letters Patent is hereby corrected as shown below:

On the title page, the Assignee should read as follows:

Item (73) Assignee: Samsung Electro-Mechanics Co., Ltd., Suwon, Gyunggi-do (KR)

Signed and Sealed this

Ninth Day of November, 2010

David J. Kappos
*Director of the United States Patent and Trademark Office*